United States Patent [19]

Gipstein et al.

[11] 3,931,435
[45] Jan. 6, 1976

[54] ELECTRON BEAM POSITIVE RESISTS CONTAINING ACETATE POLYMERS

[75] Inventors: Edward Gipstein, Saratoga, Calif.; Wayne M. Moreau, Wappingers Falls, N.Y.; Omar U. Need, III, San Jose, Calif.

[73] Assignee: International Business Machines Corporation, Armonk, N.Y.

[22] Filed: Dec. 20, 1974

[21] Appl. No.: 534,541

[52] U.S. Cl. .............. 427/43; 427/44; 96/35.1; 96/36.2; 96/115 R; 204/159.22
[51] Int. Cl.² .......................................... B05D 3/06
[58] Field of Search ........ 427/43, 44; 96/35.1, 36.2, 96/115 R; 204/159.22

[56] References Cited
UNITED STATES PATENTS
3,535,137   10/1970   Haller et al. ..................... 427/43

OTHER PUBLICATIONS
Levine et al., "Polymer Engineering and Science", Vol. 14, No. 7, July 1974, pp. 518–524.

Primary Examiner—John H. Newsome
Attorney, Agent, or Firm—Joseph G. Walsh

[57] ABSTRACT

Very sensitive electron beam positive resists have been obtained using films of polymeric methyl methacrylate containing acetate polymers.

5 Claims, No Drawings

ELECTRON BEAM POSITIVE RESISTS CONTAINING ACETATE POLYMERS

FIELD OF THE INVENTION

The present invention is concerned with electron beam resists. More particularly, it is concerned with positive resists obtained by forming on substrates thin films of poly (methyl methacrylate) containing certain acetate polymers.

PRIOR ART

Positive acting polymeric electron beam resists are well known in the prior art. Such prior art is thoroughly discussed in, for example, U.S. Pat. No. 3,535,137 of Haller et al. That patent provides a very good discussion of typical methods for fabricating and using resist materials. As is explained in that patent, the process typically starts by dissolving a suitable polymer in a solvent. A thin polymer film is then formed on a substrate by a process such as, for example, spinning a drop of the dissolved polymer on the substrate surface and allowing it to dry. The polymer film may then be baked to improve the adhesion and handling characteristics of the film. The next step involves exposing selected portions of the polymer film to electron beam radiation, in the range of 5 to 30 kilovolts. This radiation causes scission of the bonds of the polymer. As a result of such scissions, the portions of the polymer film which have been exposed to the radiation may be selectively removed by application of a developer solvent while leaving the unexposed portion of the film still adhered to the substrate. When it is so desired, the remaining polymer film may be baked to eliminate undercutting. Following this, in cases where it is so desired, the exposed underlying substrate may be etched with a suitable etchant.

Prior art materials which have been particularly successful as positive acting electron beam resists include polymeric methyl methacrylate. There are, however, relatively few materials which simultaneously possess all of the required properties to act as resists. It is necessary that the material be chemically resistant to etching solutions but still degrade under electron radiation. The material must be capable of adhering to the substrate as a film, and the film must resist cracking.

SUMMARY OF THE INVENTION

It has now been found that the speed of poly (methyl methacrylate) electron beam positive resists can be enhanced by the addition of acetate polymers. Currently used poly (methyl methacrylate) requires a charge dosage of $50 \times 10^{-6}$ Coul/cm$^2$ at 25KV. This sensitivity is too low for a manufacturing lithographic process. The present invention, however, provides an order of magnitude increase in speed enhancement by the addition of polymeric acetates to the poly (methyl methacrylate) resists.

The acetates useful in the present invention are vinyl acetate and isopropenyl acetate. When small amounts of either of these materials are incorporated in the poly methyl methacrylate resist, the sensitivity of the resist is increased. About 1% by weight of the acetate should be added to the resist composition. There is no advantage in adding more than 20% by weight, and, in fact, above this percentage difficulties are experienced in processing the resist. It is satisfactory simply to mix poly (vinyl acetate) or poly (isopropenyl acetate) with the poly (methyl methacrylate. Alternatively, the acetate monomers may be copolymerized with the methyl methacrylate monomers.

The following Examples are given solely for the purposes of illustration of the preferred embodiments and they are not to be construed as limitations of the invention, many variations of which are possible without departing from the spirit or scope thereof.

EXAMPLES

In separate experiments, poly (vinyl acetate) and poly (isopropenyl acetate) were each added to poly (methyl methacrylate) in a solvent at 5% by weight and spin coated with a thickness of 7000 A. A control of poly (methyl methacrylate) without additive was coated to the same thickness. The films were exposed to 25KV electron beam dosage. The films were then developed using amyl acetate. The thickness of unexposed and developed areas were measured for a determination of the ratio S/So. (S/So is called the solubility ratio. It is defined as the solubility of the resist after irradiation divided by the solubility before irradiation.) The higher solubility ratio obtained for the poly (methyl methacrylate) with additives proves a speed enhancement of from 8 to 10 times. The results are reported in Table I below.

TABLE I

| Additive | S/So | Dose (25 KV) | S/So | Dose (25 KV) |
|---|---|---|---|---|
| None | 4 | 12 $\mu$coul/cm$^2$ | 1.5 | 3 $\mu$coul/cm$^2$ |
| 5% PVA | 32 | " | 8.0 | " |
| 5% PIPA | 40 | " | 9.0 | " |

What is claimed is:

1. A process for forming an image with a positive resist, said process comprising the steps of:
   1. forming on a substrate a film of a composition comprising polymeric methyl methacrylate, said composition having increased sensitivity to electron beam radiation due to the presence in said composition of from 1 to 20% by weight based on said polymeric methyl methacrylate of polymerized vinyl acetate or polymerized isopropenyl acetate,
   2. exposing said film in a predetermined pattern to radiation,
   3. removing the radiation exposed portion of said film with a solvent.

2. A process as claimed in claim 1 wherein the radiation is electron beams at a strength of from 5 to 30KV.

3. A process as claimed in claim 1 wherein the film comprises about 5% polymerized vinyl acetate.

4. A process as claimed in claim 1 wherein the film comprises about 5% polymerized isopropenyl acetate.

5. A process as claimed in claim 1 wherein the solvent is amyl acetate.

* * * * *